United States Patent [19]

Plesko

[11] Patent Number: 5,519,198
[45] Date of Patent: May 21, 1996

[54] ELECTRO-OPTICAL SCANNING SYSTEM

[75] Inventor: George A. Plesko, Media, Pa.

[73] Assignee: GAP Technologies, Inc., Media, Pa.

[21] Appl. No.: 235,493

[22] Filed: Apr. 29, 1994

Related U.S. Application Data

[62] Division of Ser. No. 776,663, Oct. 15, 1991, Pat. No. 5,371,347.

[51] Int. Cl.⁶ .................................................. G06K 7/10
[52] U.S. Cl. ........................................ 235/462; 359/214
[58] Field of Search ................................. 235/462, 472, 235/492; 359/196, 198, 199, 213, 214, 202; 310/40 R, 36, 66, 23, 273

[56] References Cited

U.S. PATENT DOCUMENTS

| | | | |
|---|---|---|---|
| 2,922,894 | 1/1960 | Kerr et al. | 359/209 |
| 3,575,496 | 4/1981 | Pollock | 359/214 |
| 4,575,625 | 3/1986 | Knowles | 235/467 |
| 4,639,589 | 1/1987 | Weber et al. | 359/210 X |
| 4,871,904 | 10/1989 | Metlitsky et al. | 359/210 |
| 4,878,721 | 11/1989 | Paulsen | 359/214 |
| 4,958,064 | 9/1990 | Kirkpatrick | 235/462 |
| 4,999,491 | 3/1991 | Semler et al. | 250/236 |
| 5,059,779 | 10/1991 | Krichever et al. | 235/462 |
| 5,140,141 | 8/1992 | Inagaki et al. | 235/462 |
| 5,144,120 | 9/1992 | Krichever et al. | 235/462 |
| 5,149,949 | 9/1992 | Wike, Jr. | 235/470 |
| 5,168,149 | 12/1992 | Dvorkis et al. | 235/462 |
| 5,170,277 | 12/1992 | Bard et al. | 235/462 |
| 5,187,612 | 2/1993 | Plesko | 310/36 X |

FOREIGN PATENT DOCUMENTS

| | | | |
|---|---|---|---|
| 4001242 | 7/1991 | United Kingdom | 359/213 |

Primary Examiner—Donald T. Hajec
Assistant Examiner—Thien Minh Le
Attorney, Agent, or Firm—Reed Smith Shaw & McClay

[57] ABSTRACT

A compact beam scanning information readout device and method for reading bar code or other information requires little or no orientation of the information to be scanned by virtue of its raster or omni directional scan capabilities. Only a single mirror is needed to generate two dimensional scans. A wide range of scan speeds are also possible for simple or complex one or two dimensional patterns. Scanning in two dimensions may be done with independent and continuous control of the scan in each dimension. The scan patterns may be electronically controlled to instantly achieve various orientations ranging from a straight line rotated about a point to continuously rotating complex patterns. A light collector, light detector, processor, and means of signal transmission are also included. In one embodiment the device is packaged in a housing resembling a wand or a thin flashlight and in another embodiment the device is packaged in a ceiling mountable housing which will not interfere with counter top work space. The invention is useful wherever beam scanning equipment is used especially for barcode scanning, pattern recognition, general beam positioning, and many other scanning applications.

62 Claims, 15 Drawing Sheets

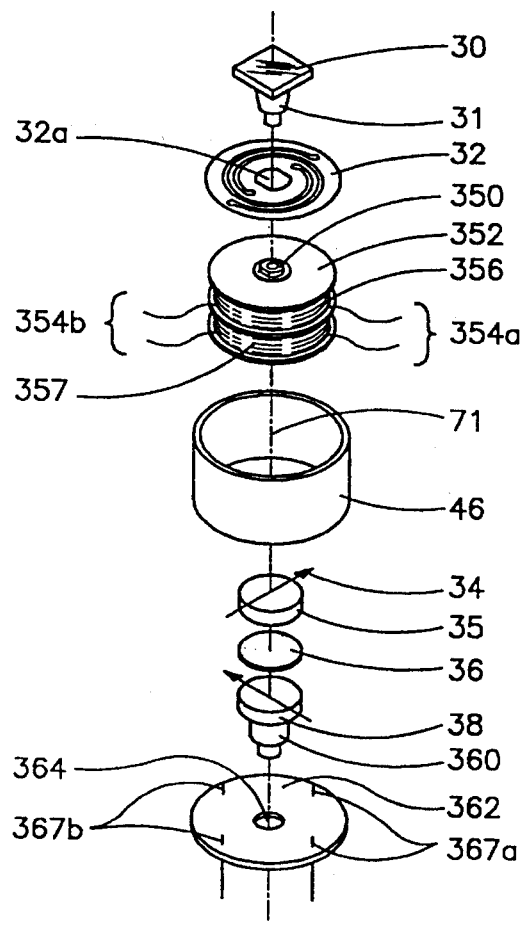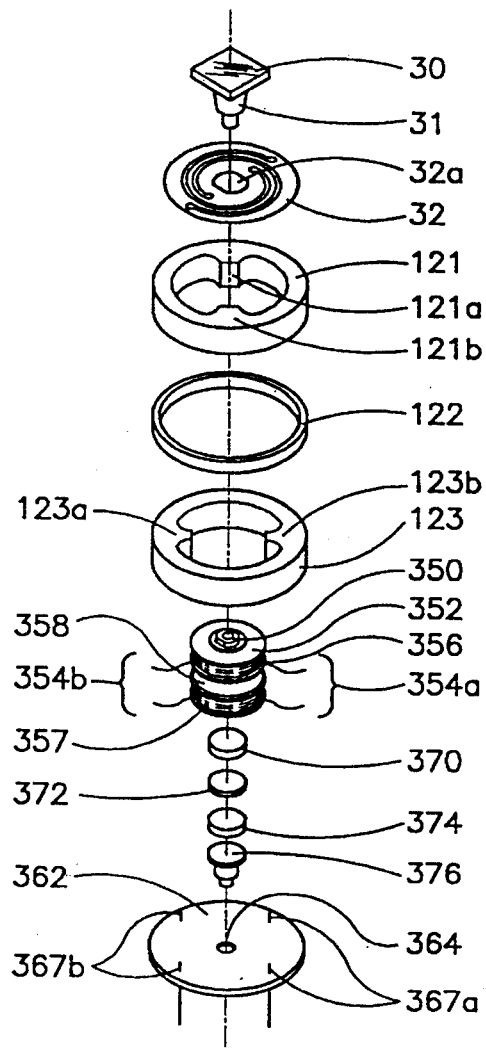
FIG. 19
FIG. 20

ELECTRO-OPTICAL SCANNING SYSTEM

This is a divisional application of application Ser. No. 07/776,663 filed Oct. 15, 1991 now U.S. Pat. No. 5,371,347. The present application also claims the benefit under 35 U.S.C. §120 of application Ser. No. 08/006,754, filed Jan. 21, 1993, which is a continuation-in-part of application Ser. No. 612,893, filed Nov. 15, 1990, now U.S. Pat. No. 5,187,612.

FIELD OF THE INVENTION

The present invention relates to providing a means of scanning a light beam in one or more dimensions to read information from the field scanned and to methods of scanning, detecting, and reading information, including barcode, alphanumeric code and pattern recognition.

More particularly the invention relates to a scanning device which is useful where it is desirable to cover an area with high density scan patterns which may be rotated in order to read information therein without having to first orient the material to be read.

In various embodiments the invention is useful in factory, point of sale, and hand held applications as a component in information gathering equipment and systems. Barcode scanning, reading and decoding of printed codes and other information, and pattern recognition are a few of the useful applications of this invention. It is particularly suited where low cost, compactness, ease of mounting, and light weight are desired.

BACKGROUND OF THE INVENTION

The field of beam scanning for the purpose of gathering information is rapidly advancing. The commercial application and importance of barcode reading is well known and is now becoming more sophisticated with the introduction of two dimensional barcodes. Code 49 is only one example of a new barcode standard that contains information in a two dimensional array. As information density increases, scanning with high speed dense scan patterns becomes necessary in order to read it rapidly.

In addition to barcode reading, the ability to read alphanumeric information is also of great commercial value. Other types of encoded information are being devised, and object recognition requiring scanning readout equipment is also of commercial importance.

The problem of having to orient barcodes with respect to the barcode reading equipment at merchandise check out counters is well known. However, automatic information reading is required in many areas where it may not be convenient for humans to orient the information to be read. Conveyor lines where barcode labels on airline luggage must be read is such an example. Besides the fixed mount scanners found on conveyor lines and under the counter point of sale terminals, portable hand held barcode scanners are also popular today. One common portable scanner which is packaged as a wand of about one half inch in diameter contains a light emitting diode (LED) and photo detector (PD). A hard transparent spherical tip is brought into contact with the barcode to be scanned and smoothly passed across the code. Light transmitted through the spherical tip from the LED is reflected off the bar code creating a modulated reflection which is transmitted back through the tip whereupon it is detected by the PD, and processed as information. The shortcomings of this system are that it requires direct contact with the code, mutual orientation of the code and direction of the stroke across all bars of the code, and a relatively non jerky pass.

Another type of portable scanner uses a laser instead of an LED in order to project a narrow light beam a considerable distance ranging from a few inches to a few feet. In this type of scanner some means of uniformly sweeping the light beam is provided, usually by reflecting it off a moving mirror. Inexpensive small motors have been adapted to oscillate or rotate such mirrors creating a scan in essentially a straight line. Stepper motors have been quite popular for this function but they are prone to causing the beam to move in a jerky fashion (non linear motion). Non linear scanning produces poor decode results.

Some of the best portable laser scanners can read information at distances of several yards and are useful for reading barcode labels where they are out of reach. But again these labels may be affixed with random orientations requiring the user of the scanning equipment to carefully orient and aim the scanner to successfully read them.

In order to read these forms of information it is beneficial to rapidly scan a light beam over the information to be read and at the same time to cover the scan area with a dense scan pattern consisting of many closely spaced scan lines. A scan line typically consists of a fast moving laser generated spot. By scanning at many different angles simultaneously or in rapid succession, the probability of successfully reading randomly oriented coded information is improved so much that the process requires no tedious aiming.

In general, in order to derive information from a scanned object, light is directed at the object, and scanned across it at a known rate. As this light is reflected or scattered back by the object, its intensity will vary when observed from a particular vantage point. This scattered light coming back from the object is essentially amplitude modulated by the absorption and reflection from the surface of the object and thus contains spatial information about the object. This information bearing signal may be detected and decoded or interpreted based upon the known direction and velocity of the scanned spot.

Numerous patents describe methods of generating multiple scan lines of various orientations and kinds but none are known for generating these with only one single optical component such as a mirror and only one moving part. Moreover, most devices for generating scan patterns are best suited for making only one type of pattern and major design modifications are required to make different scan patterns. Furthermore none of the known methods of generating high speed multiple scan lines at significant scan angles achieve this result with a single self-contained miniature low profile component which may be mounted simply with the only alignment required being to reflect a beam off its mirror.

Although some devices use mirrors mounted on a spinning motor as a component to generate beam motion, none are as compact and amenable to packaging in spaces as small as the present invention, nor are any known to be capable of generating such sophisticated scan functions as spinning rasters or spinning lissajous figures for example.

Other scan devices may use numerous holograms on a plate which mimic lenses of various focal lengths to focus a beam at different distances thereby increasing the depth of field of the scanner. At the same time the plate is rotated by a motor which causes the beam to scan. U.S. Pat. No. 4,794,237 describes such a device. U.S. Pat. No. 4,639,070 describes a plurality of rotating holograms, mirrors, prisms and gear systems to achieve scans at various angles and rotations. Separate designs with different multiple combinations of these parts are required to produce different patterns.

In U.S. Pat. No. 4,387,297 individual stepper type motors are used with mirrors attached to their shafts and positioned orthogonally so a laser beam reflects off each mirror in succession making possible the production of a raster pattern or lissajous figures, but these cannot be rotated unless the whole product is rotated.

U.S. Pat. No. 4,797,551 describes a method for producing nine fixed scan lines arranged in groups of three parallel lines at three different angles, but the optical system is complex with many mirrors all carefully aligned with many parts and it is so bulky that it would not be practical for hand held applications.

U.S. Pat. No. 4,041,322 describes the generation of polyphase patterns that look like sinusoidial waves all phase shifted with respect to one another. But this also requires multiple mirrors mounted on a spinning polygon as well as an oscillating mirror. This device cannot rotate the scan patterns nor is it portable enough for convenient hand held applications or mounting in tight spaces.

U.S. Pat. No. 4,794,237 describes a multidirectional holographic scanner which can produce scan lines at many angles. This however requires as many as five mirrors and numerous holograms all mounted on a disk which is rotated by a motor.

U.S. Pat. No. 4,409,469 describes a scanning device which includes a mirror mounted on a wedge. The wedge is spun by a motor causing a beam reflected from it to reflect off multiple mirrors mounted in a circle around the spinning mirror.

None of the known two dimensional scan devices can generate multiple scan lines at different orientations with only one mirror, none are single component items, none have a great palette of possible scan patterns while at the same time are practical to mount in a thin tubular housing small enough to be held in a person's hand and none have a single beam shaping device capable of producing a scanning spot of essentially the same small size over great distances.

SUMMARY OF THE INVENTION

It is an object of this invention to provide a means of electronically controlling the orientation of scan patterns rather than orienting the target material which may be bulky and randomly presented.

It is another object of this invention to move the scanning spot with great consistency, that is, without jerking it and at a uniform speed or at least at a speed that is very predictable.

It is yet another object of this invention to achieve multiline or omnidirectional scanning action by means of as few component parts as possible.

It is a further object of the invention to provide a means of generating omnidirectional scanning capability with only one single optical scan component such as a mirror set in motion by only one small moving device which may be made as a single component.

Another object of this invention is to provide a very compact reading device, which may be housed in a thin flashlight style housing while providing for sophisticated high speed omnidirectional scan capabilities heretofore found only in large nonportable equipment.

Another object is to do away with the need for dangling wires and cables from the equipment thereby making it easier to handle or install.

Yet another object of this invention is to provide a miniature low mass high speed scanning device, capable of scanning wide angles in one or more dimensions with independent control.

It is a further object of this invention to provide a means of generating oscillating scan lines by a device which has intrinsically long life by eliminating bearings in the device.

In accordance with the foregoing objects, the scanning system of the present invention include one or more of the following: a novel gyrating scanning head which can produce linear or multidirectional scanning patterns from a single fixed light source using a single optical element; a novel light concentrator which concentrates light by means of total internal reflection in a solid transparent medium; an electronically focusable light source; a light beam shaping device which produces a narrow beam near the scanning device and a rapidly diverging beam far from the scanning source; and a communication system for communicating scanning information from the scanner to a remote location. Such scanning systems are mountable in small hand-holdable flashlight-style housings, or at fixed locations near the area to be scanned. Other objects and features of the invention will become apparent upon review of the drawings, the following description thereof, and the claims.

BRIEF DESCRIPTION OF THE DRAWINGS

FIG. 11b is an illustration of a scanning system including the novel light collector of FIG. 11a.

FIG. 19 is an exploded illustration of a third gyrating scan head according to the present invention which uses a gyrating coil.

FIG. 20 is an exploded illustration of a fourth embodiment of a scan head according to the present invention, which uses a gyrating coil and a magnetic frame.

DETAILED DESCRIPTION OF THE INVENTION

Figure 1:
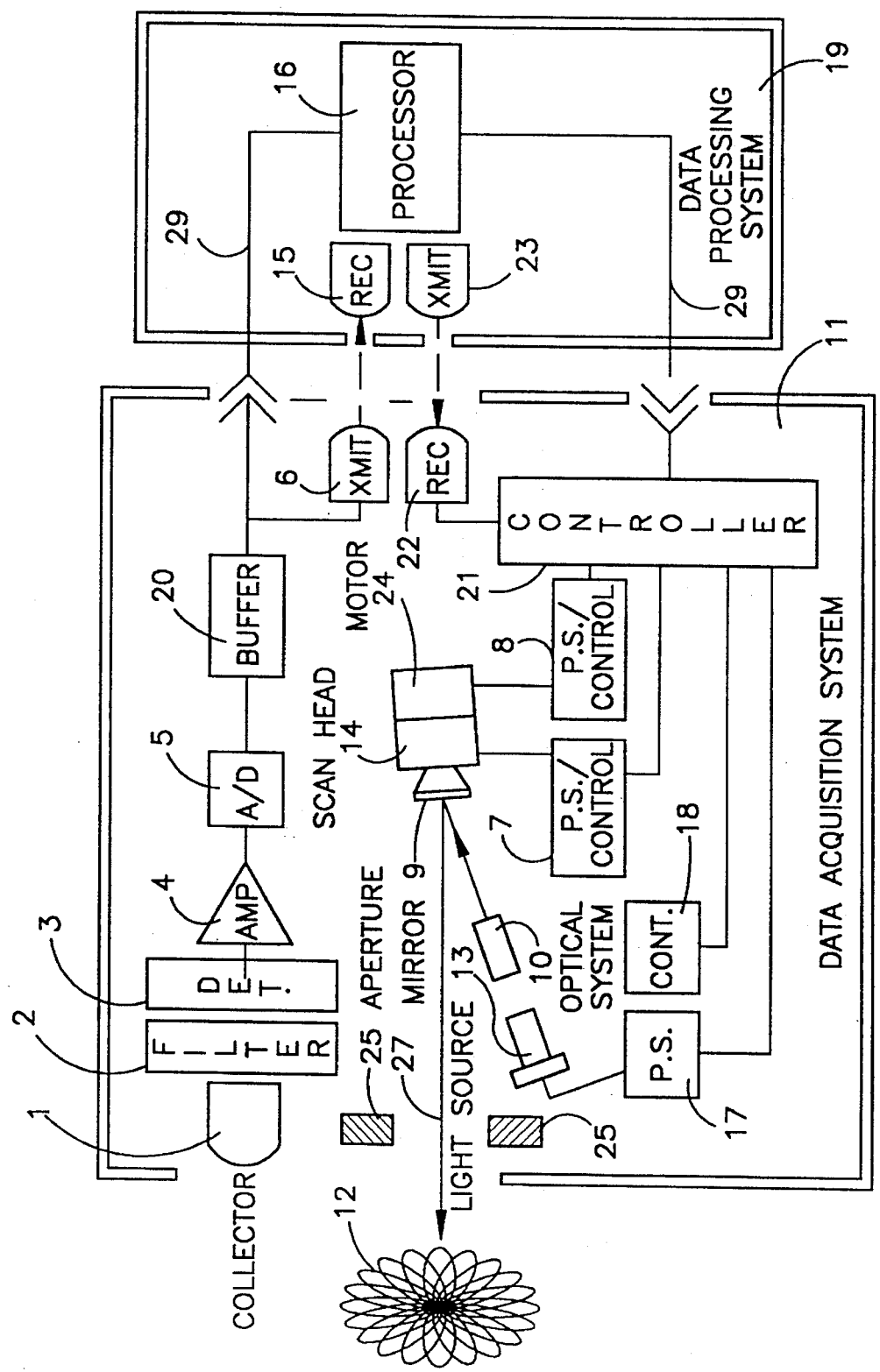
FIG. 1 is a schematic drawing of the principal component of a scanning system.

FIG. 1 is a schematic drawing of the principal components of a scanning system according to the invention. As illustrated, the system includes into an optical scanning data acquisition system 11 which communicates acquired data via a communication channel to a data processing system 19, which processes the acquired data as required by the application. These subsystems may be physically integrated or separated; for instance, certain point of sale systems use a self contained system under a checkout counter, whereas other such systems include a hand-held data acquisition system coupled by a cable to a point of sale terminal.

The data acquisition system 11 includes a light source such as a semiconductor laser 13 powered by laser power supply 17. The light source produces a light beam which is shaped and focused in an optical system 10. The focus of optical system 10 may be varied by control element 18, for instance to automatically focus the beam. The shaped beam from the focus element 10 is directed at an optical element such as a mirror 9 which redirects the beam 27 toward the target area located at 12. The beam is shaped and focused by the optical system 10 so that the spot is of sufficiently small diameter where it encounters the target to be scanned in order to resolve the information therein. The position and motion of mirror 9 are controlled by a device typically referred to as a "scan head" to produce the desired scan pattern of beam 27 at location 12. Scan head 14 is powered by a scan head power supply and control unit 7, which typically includes a waveform generator. Aperture 25 may be provided to clip unwanted nonlinear fringes of the scan pattern. The scan head power supply and control unit 7 may produce more than one set of independent waveforms in order to drive the scan head 14 to produce motion of the mirror in independent dimensions, making possible the generation of desirable two dimensional scan patterns. A motor 24 mechanically coupled to scan head 14 and electrically coupled to motor power supply and control unit 8 may be provided in order to permit orientation or rotation of the scan head 14 and thereby to position, rotate and/or dither the scan pattern produced by the system. Light from the target area is supplied to a photoelectric converter which converts the light signals into electrical signals of a desired form for further processing. In FIG. 1, the photoelectric converter comprises light detector 3, amplifier 4, digitizer 5, and buffer 20. A light detector 3 such as a photo diode transforms the collected light into electrical signals which are typically amplified by amplifier 4 and then digitized by the digitizer 5, making them suitable for digital processing. A signal buffer 20 may be used to store information from the digitizer 5 so that it may be transmitted at a suitable rate to an information processing device 16 such as a computer in data processing system 19.

A light collector or concentrator 1 may be provided to collect and concentrate the diffusely reflected light from the scanned target at 12 on the light detector 3, and the collected light typically passes through a filter 2 to remove unwanted ambient and stray light not of the wavelength produced by the light source 13. The light collector 1 may be constructed so that it is made from a material that filters the diffusely reflected information bearing light signal, thereby eliminating the need for a physically separate filter component.

FIG. 1 shows two alternatives which may be used to transmit information between the data acquisition and the data processing portions of the scanning system. One alternative is a solid or closed communication channel 29, such as a cable comprising electrical conductors or fiber optics. Such a channel may be used, together with any necessary signal conversion electronics, where an electrical or optical cable between the data processing system 19 and the optical data acquisition system 11 is not a substantial disadvantage. In many circumstances, however, it will be desirable to have a portable or otherwise remote data acquisition system 11 communicate by wireless means with a data processing system 19. To facilitate such communication, transmitters 6 and 23 may communicate with receivers 15 and 22 over an RF, infrared, ultrasonic, or other such wireless communication channel.

A controller 21 may be provided to control the elements of the scanning data acquisition system such as by turning the laser power supply 18 on and off, adjusting the focus of the optical system 10, controlling the motor drive 8 and the scan drive 7. Controller 21 may also receive information from data processing system 19 via receiver 22 in order to initiate, continue and stop the scanning sequence.

Figure 17:
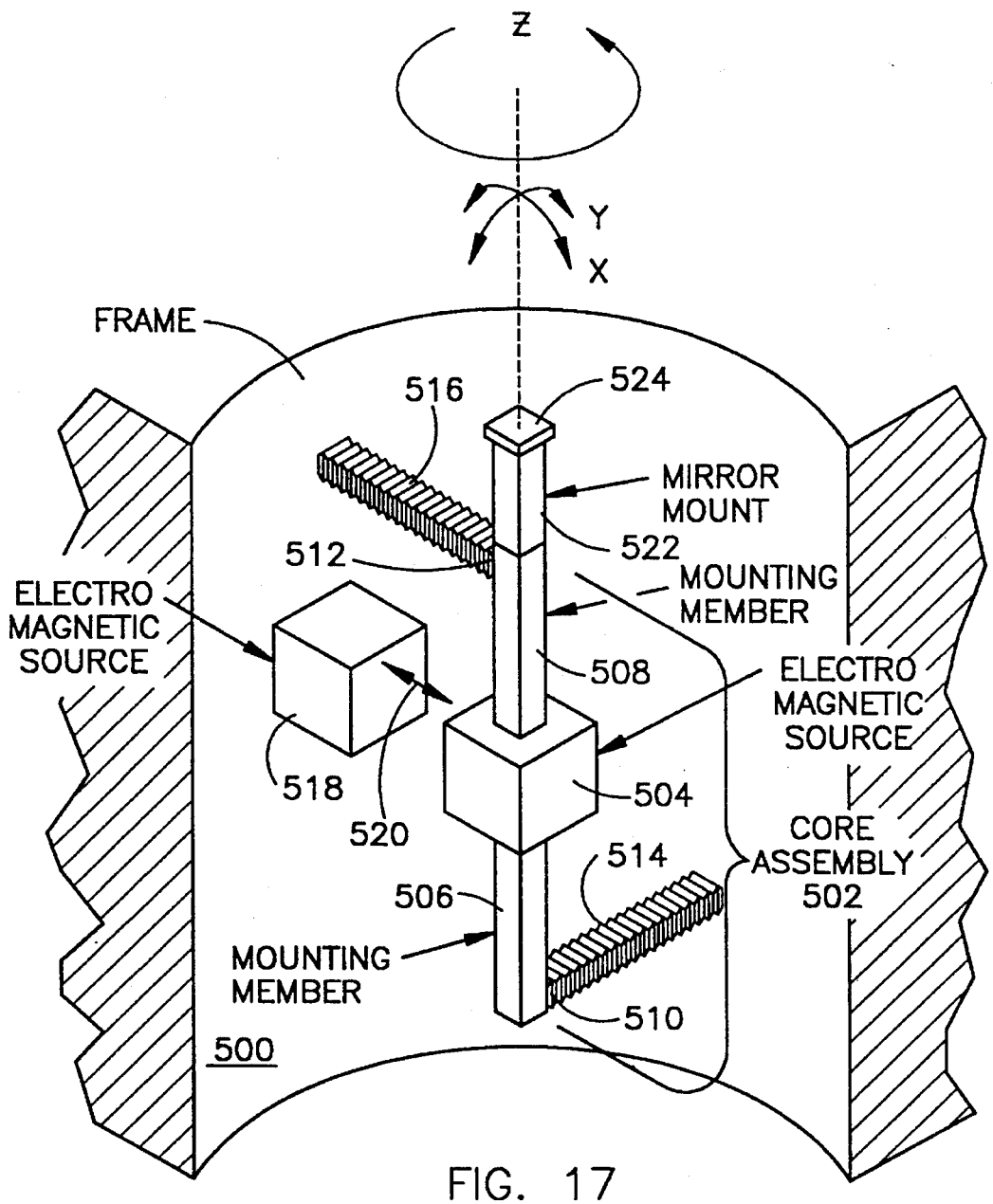
FIG. 17 is a schematic diagram illustrating the general features of a gyrating scan head according to the present invention.

FIG. 17 is a schematic diagram illustrating the general features of a gyrating scanning component or scan head in accordance with several embodiments of the present invention. The scan head is adapted to move an optical element 524 so that an incident beam directed at the optical element from a fixed light source is redirected to provide a positionable spot or a moving spot, i.e. a scan line, in a target area. Typically, optical element 524 is a flat mirror but it may also include other types of reflective elements or refractive elements. An electromagnetic source 504 is provided, which is mechanically coupled to a frame 500 by a suspension comprising suspension members 514 and 516 and by mounting members 506 and 508 affixed to source 504. As used herein, an electromagnetic source is a device producing an electric and/or magnetic field and which is capable of interacting with an electric and/or magnetic field produced by another device so as to provide a force between such devices. Such sources include permanent magnets and conductors such as coils which carry a current. Mounting members 506 and 508 may be separate physical components or may be fabricated as integral parts of source 504. Source 504 and mounting members 506 and 508 form an assembly 502, which may be referred to herein as a gyrating member or gyrator because of its motion as described below, and which may be referred to in specific embodiments as a core assembly when electromagnetic source 504 is embodied as a magnetic core.

Suspension members 514 and 516 are coupled to gyrating member 502 at mounting points or locations 510 and 512, respectively. Mounting points 510 and 512 define an axis labelled the Z axis in FIG. 17. Suspension members 514 and 516 suspend gyrator 502 so that the Z axis has a particular orientation with respect to frame 500 in the absence of electromagnetic force upon source 504, i.e. an equilibrium orientation and an equilibrium positioning of mounting points 510 and 512. At least one of the suspension members, member 516, is resilient; that is, if mounting point 512 is displaced from its equilibrium position, suspension member 516 provides a restoring force urging mounting point 512 toward its equilibrium position. Suspension member 514 may maintain mounting point 510 fixed at its equilibrium position, or may be resilient as described above with respect to suspension member 516. Thus suspension members 514 and 516 permit core assembly 502, or at least a portion thereof, to move in at least one direction perpendicular to the Z axis, for instance in the X or Y directions indicated. Such movement is in an arc about some center of rotation on the Z axis, which center is determined by the suspension. For instance, if suspension member 514 maintains mounting point 510 fixed with respect to frame 500, all points other than 510 on or rigidly coupled to core assembly 502 will move in arcs centered on mounting point 510. If suspensions 514 and 516 are equally resilient, all points on gyrating member 502 may move in arcs centered at a point midway between mounting locations 510 and 512. For points on the Z axis, such motion is perpendicular to the Z axis and has components in the X and/or Y directions indicated. Such motion in an arc about a point on the Z axis is referred to herein as "gyration", a member undergoing such movement is referred to as a "gyrator", and the Z axis is referred to as the axis of gyration of the gyrator. Such gyrating motion is to be distinguished herein from rotation about the Z axis. As will be seen, several embodiments of the invention also provide or permit such rotation about the Z axis in addition to gyration. Gyration of core assembly 502 may occur only in a single direction, such as the X direction, or may have components in two perpendicular directions X and Y. By way of analogy with aeronautical terminology, rotation about the Z axis is analogous to roll, and gyration in the X or Y direction is analogous to pitch or yaw.

While the suspension described above permits gyrating motion, an operable scan head further requires means for applying a force to the core assembly to move it from its equilibrium position so as to induce gyration. In the generalized diagram of FIG. 17, such force is applied by interaction 520 of electromagnetic source 504 of the core assembly and electromagnetic source 518 coupled to frame 500.

Typically one of the electromagnetic sources will comprise one or more permanent magnets, and the other source will comprise one or more coils which may be energized by a controllable electric current to produce a controllable magnetic field and consequently a controllable force on gyrator 502. However, it may be desirable to use coils in both sources. In the certain of the specific embodiments of the generalized system which will be discussed below, the fixed source 518 comprises a coil and the moving source 504 of the core assembly 502 comprises a permanent magnet. However, in another embodiment these are interchanged to provide a moving coil system.

The fields produced by electromagnetic sources 504 and 518 may have a variety of orientations with respect to frame 500, to the Z axis, and to each other. All that is required of such sources for purposes of this invention is that they interact to move gyrator 502 from its equilibrium position so as to induce gyration of the gyrator.

FIG. 17 illustrates optical element 524 as being coupled to gyrator 502 along the Z axis by mirror mount 522. While such orientation is used in the specific embodiments discussed below, it is not a requirement of the invention. An optical element coupled to gyrator 502 at any location will undergo at least an angular displacement during gyration which will result in a change in the angle at which the incident light beam is redirected, and will thereby provide beam positioning or scanning.

FIG. 17 illustrates electromagnetic source 504 as being disposed between mounting points 510 and 512. While this disposition is used in the preferred embodiments discussed below, and provides a compact scan head which is frequently desirable, it is also possible to mount the electromagnetic source 504 otherwise, such as in cantilever fashion.

It should be understood that FIG. 17 is highly schematic, and is not intended to represent the physical shapes of elements performing the functions indicated. For instance, in FIG. 17 the suspensions are depicted for convenience as elongated members, and while a system might in fact be constructed with such suspensions, the preferred embodiments are radially symmetric and use radially symmetric suspension members such as spiral springs.

First Embodiment of a Scan Head

Figure 2:
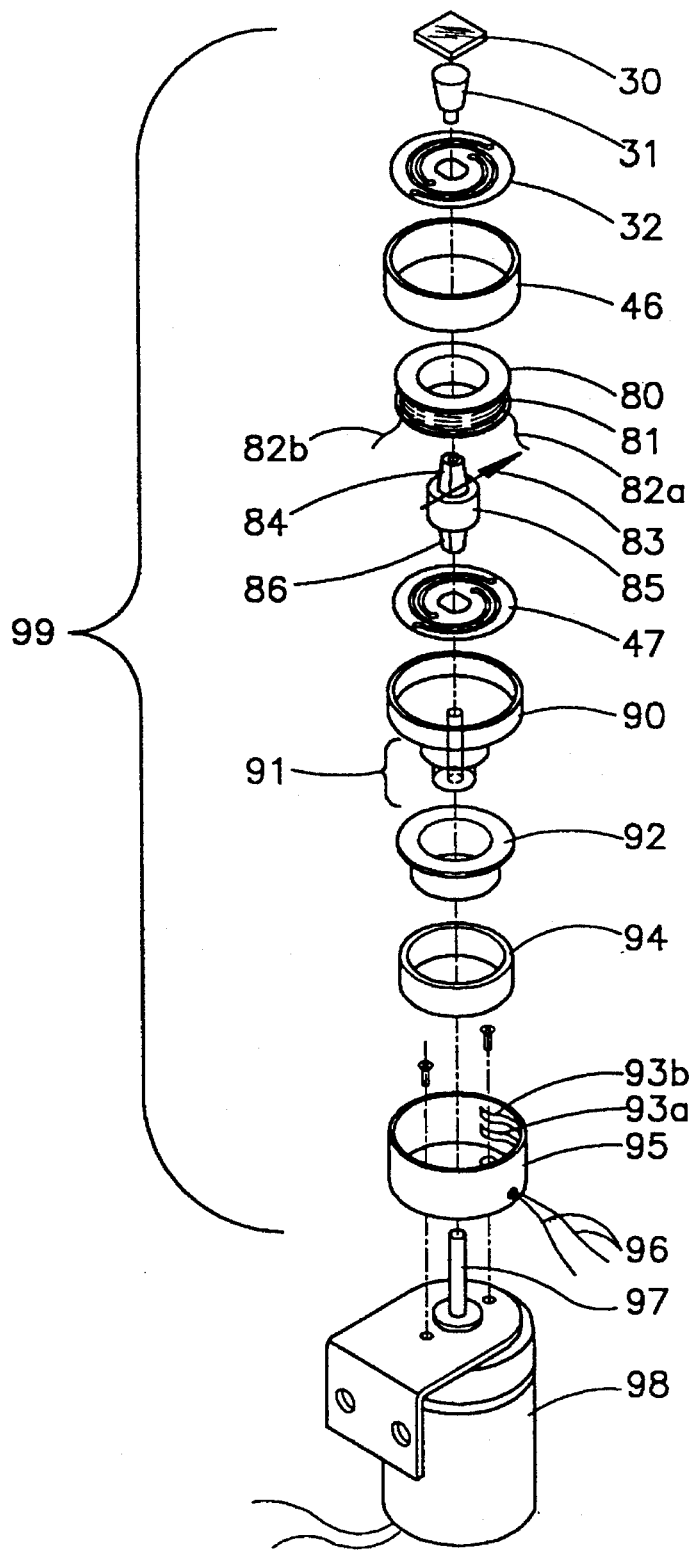
FIG. 2 is an exploded view of a first embodiment of a scan head according to the present invention.
Figure 3:
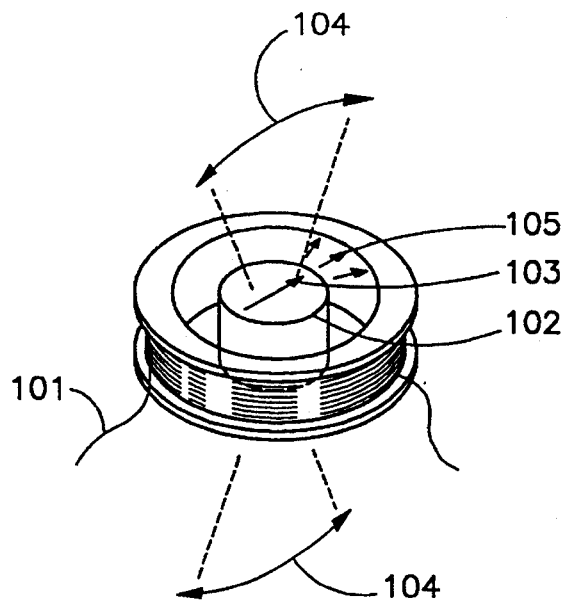
FIG. 3 is an illustration of a coil and core showing the gyrating motion produced by the scan heads of the present invention.
Figure 4:
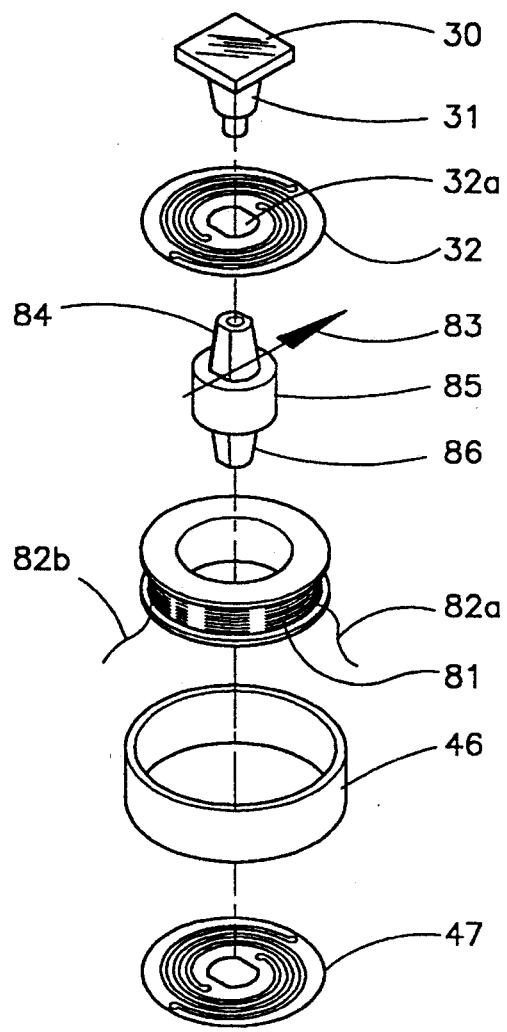
FIG. 4 is a more detailed exploded view of the first embodiment of the invention, illustrating the core suspension in greater detail.

FIGS. 2–4 illustrate a first embodiment of gyrating scan head according to the invention. FIG. 2 shows an exploded view of one embodiment of a scan component, including a first embodiment of a gyrating scan head 99 and means for rotating the scan head and making electrical connection to it. A gyrator includes a mirror 30 attached by means of a mirror mount 31 to a magnetized core assembly including a magnet 85. The direction of magnetization of the magnet 85 is in the direction of the arrow 83, which direction may be referred to as its magnetic axis. The magnetic core assembly is flexibly suspended at both ends adjacent frame 46 by resilient suspension means. Each suspension may comprise one or more flat spiral springs 32 and 47 with multiple spiral arms. The springs 32 and 47 may be made from a suitable metal such as beryllium copper when great stiffness is required for high frequency operation. The springs 32 and 47 are designed so that they are not stressed beyond their yield strength when they execute the excursions and vibrations required of them. Mounting members 84 and 86 affixed to magnet 85 engage springs 32 and 47 to couple the core assembly 84, 85, 86 to the suspensions.

Surrounding the magnetized core 85 is a coil 81, which for convenience may be wound on a plastic bobbin 80. The coil 81 is surrounded by a frame 46 which is preferably magnetically conductive, i.e. of high permeability. Iron is a suitable material for the frame 46. A magnetically conductive frame 46 serves as an efficient return path for the magnetic field produced by the magnetized core 85 as well as a frame means for supporting the suspension and gyrator. This efficient return path reduces the power necessary to operate the device, and permits operation at low coil current levels. While separate elements might be used as a frame and a magnetic return path, it is preferable to use a magnetically conductive member to serve both functions.

At the core suspension end opposite the mirror end is a conductive metal end cap 90 to which one of the coil lead wires 82a may for convenience be attached, preferably the ground or common lead. An electrically conductive brush 93a makes electrical contact with the far end of the end cap neck 91 to act as a current path to coil wire 82a. An insulating spacer 92 is also located on the end cap neck 91 over which a conductive ring 94 (commutator) is fitted. The second lead wire 82b from the coil 81 is attached to the commutator ring 94 and a second brush 93b makes electrical contact with this ring. Both brushes 93a and 93b are held by an electrically insulating brush holder 95 which may be mounted by screws to a small motor 98.

The scan head assembly 99 described above is attached by neck 91 of end cap 90 to a motor shaft 97 of motor 98 so that it may be rotated. While it rotates, current may be supplied to the coil 81 through the brushes 93a and 93b.

Line Scan Mode of Operation of the First Scan Head Embodiment

The gyrating operation of the scan head of FIG. 2 may be described by referring to FIGS. 3 and 4. Coil 101 comprises turns of wire in the general form of a cylindrical shell about the Z axis. Magnet 102, which is preferably cylindrical, is disposed within coil 101 with its magnetic axis 103 directed generally perpendicular to the Z axis. If a DC current is introduced into the coil 101, a coil magnetic field is produced in the direction of the Z axis. The field 105 from the magnetized core 102 will interact with the coil current and field, causing a torque force between the coil and the core. This force urges magnetic core 102 to tip in a direction 104 perpendicular to the Z axis, by rotation about an axis mutually perpendicular to the Z axis and the magnetic axis 103.

Now referring to FIG. 4, a spring suspension consisting of springs 32 and 47, coupled to frame 46 and suspending the magnetized core 85 within frame 46 and coil 81, serves to oppose this tipping motion. If the current is turned off, the spring suspension will return the core to its normal equilibrium position. If a current of opposite polarity is introduced into the coil, tipping of the core will likewise occur in the opposite direction.

By introducing an alternating current of a particular frequency into the coil the tipping action or gyrating oscillation of the core will occur at that frequency. This causes the mirror 30 attached to the magnetic core 85 to oscillate so that when a light beam is reflected off the oscillating mirror a straight line scan is produced. Because of the symmetry of the magnetic system just described and the linear nature of the spring, this system is not susceptible to producing jerky scan motion. In fact, the motion of the core is substantially linear, or essentially proportional to the current in the coil.

Now referring to FIG. 2 it is seen that if the motor 98 is made to rotate the front end scanning assembly 99 attached to its shaft 97, the orientation of the scan line may be changed from horizontal to vertical or to any arbitrary orientation desired. By appropriate automatic controls such orientation can be adjusted for use on a production line, for example, where scanning requirements may change for different items. A stepper motor is ideal for producing and controlling such orientations of the scan head 99 and its resultant pattern whether it be a line or some other pattern.

Figure 5:
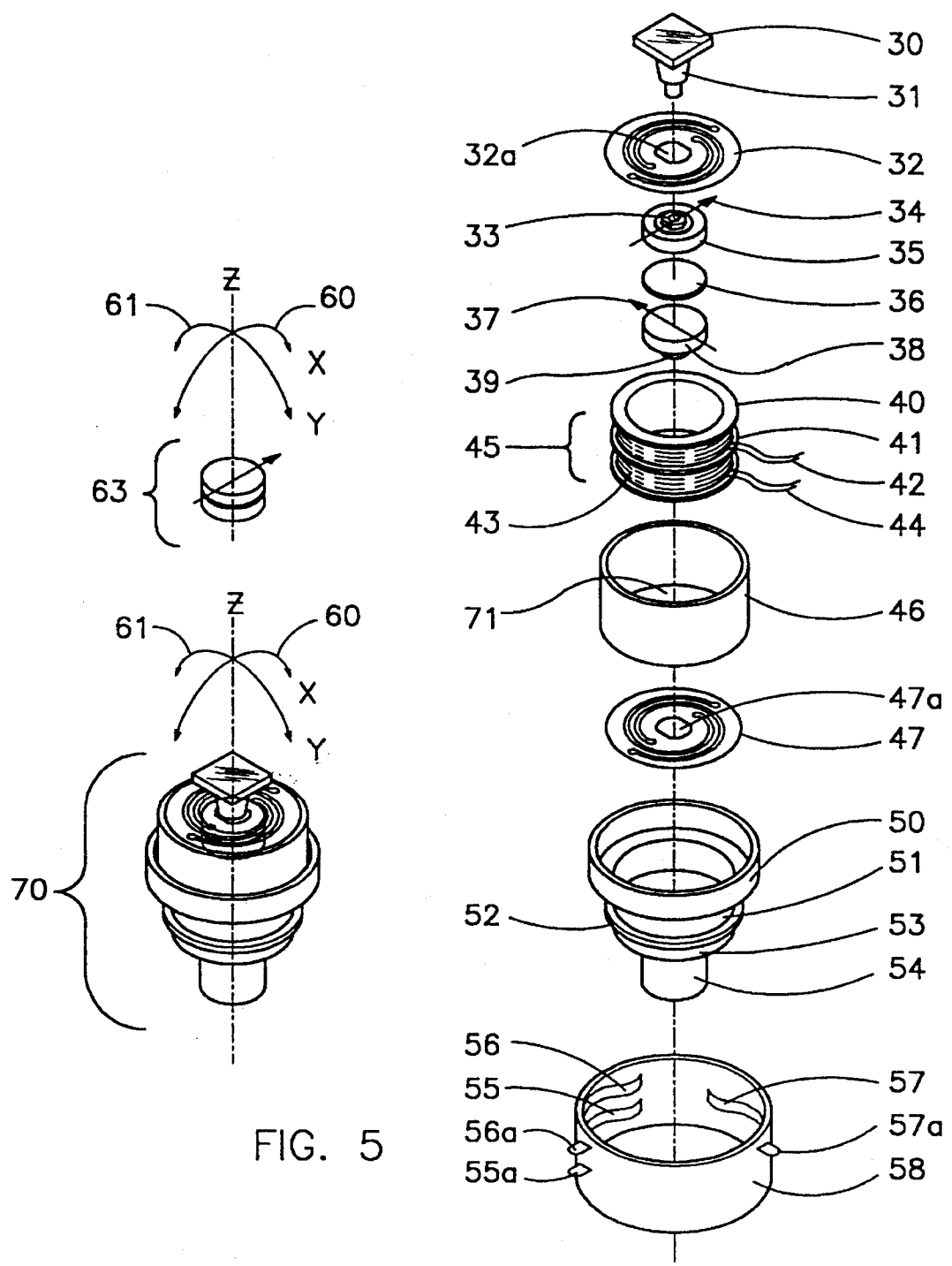
FIG. 5 is an exploded view of a second embodiment of a scan head according to the present invention, which permits gyration in two perpendicular directions.

Second Embodiment of a Scan Head, with Two Independently Controllable Degrees of Motion Now referring to FIG. 5 we see an exploded view of a modified scan head 70 which enables controlled movement of a mirror in two independently controllable X-Y dimensions 60 and 61, in which elements which are the same as in FIG. 2 are indicated by the same reference numerals. The core assembly includes the two permanent magnets 35 and 38 which are separated by and bonded to a nonmagnetic disc 36 to form a dual magnetic core 63. A flexible suspension provided by suspension springs 32 and 47 allow for X-Y motion 60, 61 of the dual magnetic core 63.

Permanent magnets 35 and 38 have short posts 33 and 39 acting as mounting members attached to their surfaces which lock firmly into oblong shaped holes 32a and 47a respectively, located in the central area of the suspension springs 32 and 47. A mirror 30 is bonded to mirror mount 31 which is attached to the top surface of post 33. The directions of magnetization of the magnets 35 and 38 are indicated by arrows 34 and 37 and are arranged at different angles, preferably right angles to one another. Magnetic axes 34 and 37 are generally perpendicular to the Z axis. Magnetic axes 34 and 37 are also generally perpendicular to each other. The nonmagnetic disc 36 separates the poles of each magnet so that a substantial portion of the field from each magnet will tend to pass through the thin walled double coil 45 and into the ring 46 made from magnetically conductive material such as soft iron. The field from the north pole of each of the magnet will be returned to its respective south pole by means of the low reluctance path provided by the magnetically conductive ring 46. The low reluctance path allows for much greater efficiency than would be possible without the magnetic ring 46.

The two permanent magnets 35 and 38 are suspended within the coil 45 so that the field from magnet 35 preferentially passes through the winding of the upper coil 41 while the field from magnet 38 preferentially passes through the winding of lower coil 43.

Figure 6:
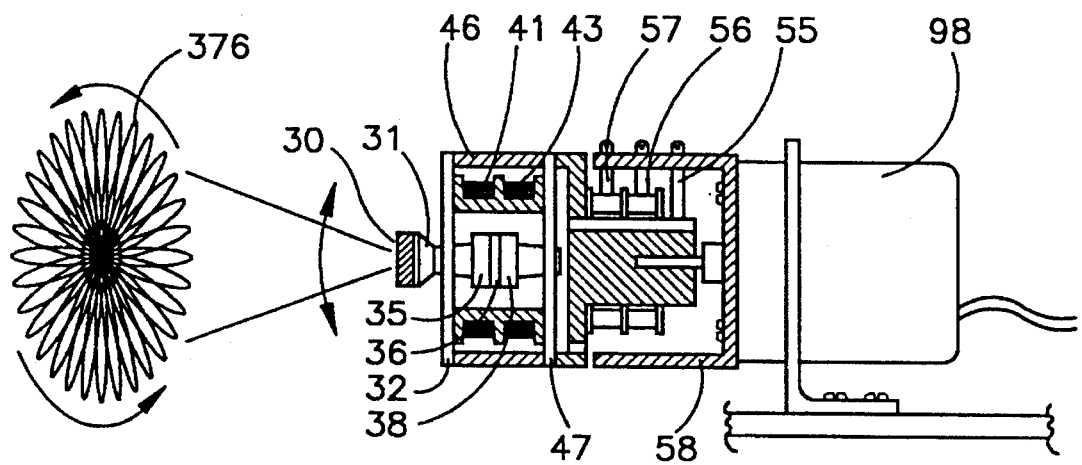
FIG. 6 illustrates a scan head according to the invention which is mounted to a motor for producing rotating scan patterns.

If an alternating current of frequency $f_1$ is introduced into coil 41, the magnet 35 will rock or gyrate in the X direction 60 at frequency $f_1$. Likewise if an alternating current of frequency $f_2$ is passed through coil 43, this will cause magnet 38 to rock or gyrate independently in the Y direction 61 at frequency $f_2$. If a light beam is directed at the mirror 30 attached to the dual magnetic core 63 assembly while coils 41 and 43 are supplied independent currents, many useful two dimensional scan patterns can be produced which are controlled by the waveforms of the currents supplied to each of the coils. Current is supplied to the coil leads 42 and 44 through brushes 55, 56, and 57 which are held in contact with commutator rings 51, 53, and 54. Terminals 55a, 56a, and 57a are terminals from the brushes. Commutator ring 54 is common to both coils so that only three terminations to the two coil assemblies are needed. Insulating spacer 52 separates commutator rings 51 and 53. Insulating brush holder 58 holds the brushes in place and itself may be attached to the body of a motor 98 as illustrated in FIG. 6. The motor can then be used to independently control the orientation of the scan head and the pattern it generates or it may be used to continuously rotate the scan pattern at the desired speed.

In this manner an omnidirectional scan pattern consisting of a rotating raster 376 of many essentially parallel lines may be generated by a preferred embodiment of the invention just described.

High Frequency Operation and Resonance

The use of only two springs 32 and 47 as shown in FIG. 2 imposes a limit upon the maximum frequency obtainable with springs of a given size. As springs of a given length are made stiffer by making them from thicker cross sections of metal, the amount of deflection they can withstand without failure becomes smaller. In many applications it is desirable to achieve both high scanning frequencies and reasonably large mirror deflection. The requirement for high frequency operation and large deflection are often in conflict in scan equipment such as opto-acoustic scanners, piezoelectric scanners and galvanometers. In this invention even greater suspension stiffness without overstressing the individual springs and therefore higher scan frequencies may be achieved by including more than one suspension spring at one or both suspensions.

Figure 7:
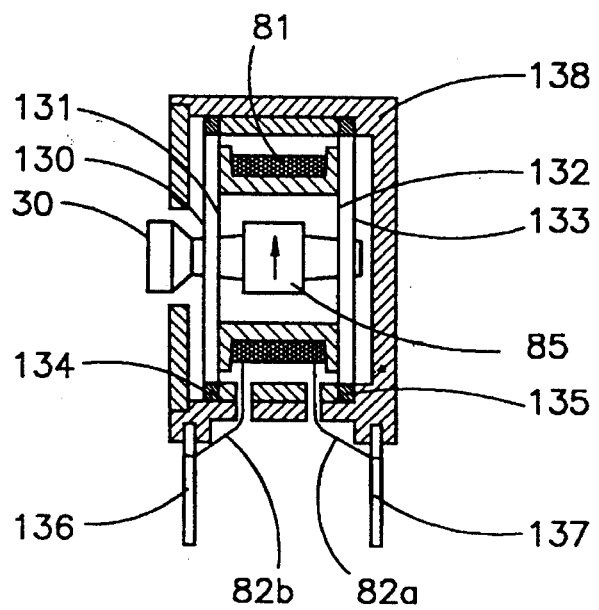
FIG. 7 illustrates a scan head according to the invention which is adapted for fixed mounting and which includes a modified suspension.
Figure 8:
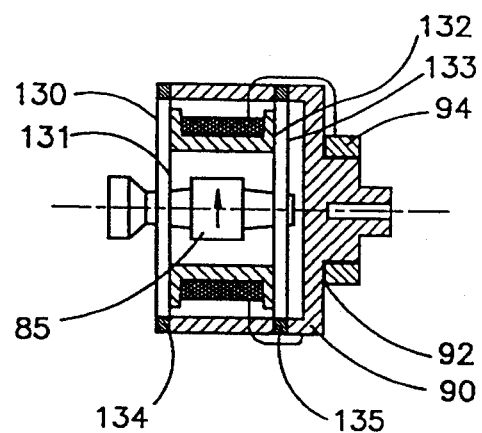
FIG. 8 illustrates a scan head according to the present invention which incorporates a modified suspension and which is adapted to be mounted to a motor shaft for rotation.

FIGS. 7 and 8 illustrate several scan heads which use multiple springs 130, 131, 132, 133 separated by thin ring spacers 134 and 135 at the ends of the core 85 to produce greater stiffness which makes very high frequency operation possible with very little increase in bulk, length or inertia. The spacers are used to prevent friction from occurring between the spring layers.

At certain frequencies, resonances of the moving mirror and magnetic core occur. The power needed to sustain oscillation is a minimum at these resonance frequencies. The number of different resonance frequencies is primarily governed by the construction of the suspension system and the spring constants associated with the springs. It is well known that the resonance frequencies of a spring-and-mass system are determined by the stiffness of the suspension springs and the number of them, as well as the moment of inertia of the mass system attached to it. In this invention the magnetic core assembly and mirror assembly represent the mass system having a certain moment of inertia about a given axis.

Due to the construction of the inventive scan head components of this invention the distance between the suspension springs also has a major influence on resonance frequencies of the system. The farther apart the springs are made the higher the resonance frequencies will be for any given set of parts.

For example, in the construction described in FIG. 5 the distance between the springs is determined by the length of the iron frame 46 of the scan head 70. A scan head 70 may be made to have higher resonance frequencies by lengthening the frame 46 along the axis 71 while not changing other features of the scan head 70 design. Also as previously mentioned more than one spring may be added to each end of the body 46 to further increase its resonance frequency. By using multiple layers of springs at both ends of the core suspension system, much higher frequencies may easily be achieved.

High frequencies of operation are particularly useful when scanning fast moving objects, or where dense or large amounts of information are in the target area. Also, fast scanning is essential to quickly cover an area with dense two dimensional scan patterns as illustrated in FIG. 12. Scanning two dimensional bar code is one example where high speed scanning is advantageous.

The high frequency capability, small diameter and ability to rotate scan patterns are very useful features of the scan heads of this invention. Prototypes of the rotating scan head portion of this invention have been made which are only one half inch in diameter and one quarter inch long and achieve rates of scan on the order of a thousand scans per second at substantial angles.

Moving-Coil Gyrating Scan Heads

FIG. 19 shows an embodiment of a gyrating scan head which differs from those previously described in two ways. First, unlike the generalized scan head in FIG. 17 and the embodiments of FIG. 2 and 5, the scan head of FIG. 19 suspends the gyrator by only one suspension member. Second, unlike the embodiments of FIGS. 2 and 5, the FIG. 19 scan head uses a moving coil rather than a moving magnet.

The frame 46 supports at its upper end a flat spiral suspension spring 32. A dual coil assembly 352a is secured by a projection 350 to a central opening 326 in spring 32. The coil assembly includes an upper coil 356 and a lower coil 357, which are coaxial with and spaced along the Z axis. A mirror 30 is secured to projection 350 by a mirror mount 31.

A base 362 is mounted to the lower end of frame 46. Secured to base 362 is a magnetic core assembly including upper magnet 35 and lower magnet 38, which are separated by a spacer 36. The directions of magnetization of magnets 34 and 38 are generally perpendicular to the Z axis and to each other. The magnetic core assembly is supported in a central hole 364 in base 362 by a neck 360 attached to magnet 38. Leads 354a and 354b of the coils are connected to pins 367a and 367b in base 362 to provide external electrical connection to the coils.

Thus, like the FIG. 5 embodiment, FIG. 19 includes a pair of magnets which are spaced from each other along the Z axis and have magnetic axes perpendicular to the Z axis; a pair of coils each surrounding and adjacent to one of the magnets and coaxial with the Z axis; and a magnetically conductive frame coaxial with the Z axis. However, because the magnets in FIG. 19 are held fixed with respect to the frame 46 and the coils are resiliently suspended, when current is supplied to one or both of the coils the resulting torque will cause the coil assembly to gyrate, which in turn gyrates the mirror. Because the coils may be made less massive than the magnets they may be suspended by one suspension member as shown, while providing sufficiently high frequency response. An additional suspension may be provided at the lower end of the coil assembly if desired, and any suspensions may be of the multiple spring form previously described. By providing sufficient slack in the flexible leads 354a and b, electrical connection may be maintained during gyration of the coils.

FIG. 20 shows a variation of the moving coil system of FIG. 19, in which the magnetic functions of the frame and the core have been interchanged. In FIG. 20, the frame is constructed from a pair of annular magnets 121 and 123, which are separated by a nonmagnetic spacer 122. Magnet 121 has poles 121a and 121b which define a magnetic axis generally perpendicular to the Z axis. Magnet 123 has poles 123a and 123b which define a magnetic axis generally perpendicular to that of magnet 121 and to the Z axis. A dual coil gyrator is suspended from the upper surface of magnet 121 by a spiral spring 32. Magnetic return elements to conduct the field between the magnet poles are disposed along the Z axis within the coils. These return elements may be made of a high permeability material such as iron. When the scan head is assembled, return member 370 is adjacent the upper coil 356 and return member 370 is adjacent the upper coil 356 and return member 374 is adjacent the lower coil 357. Return members 370 and 374 are separated by a nonmagnetic spacer 372 and mounted to a base by engagement of member 376 with hole 364.

Figure 18A:
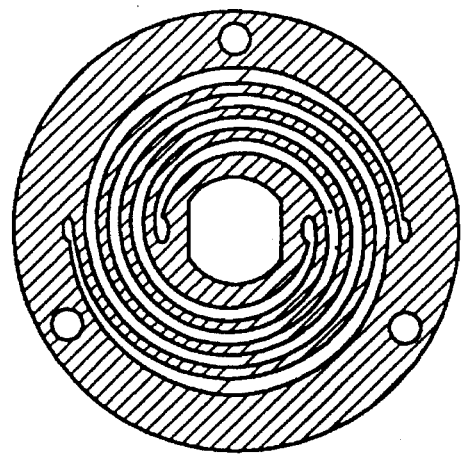
FIGS. 18a–18c are illustrations of suspension springs which may be used in the scan heads of the present invention.
Figure 18B:
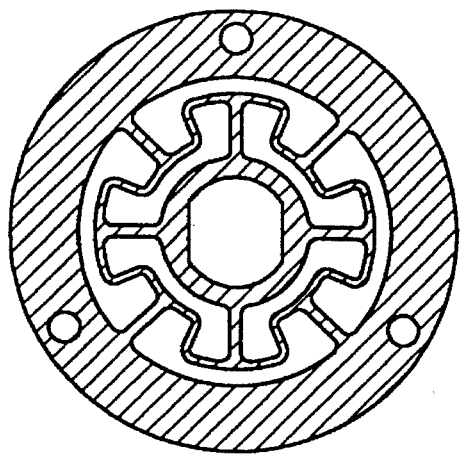
Figure 18C:
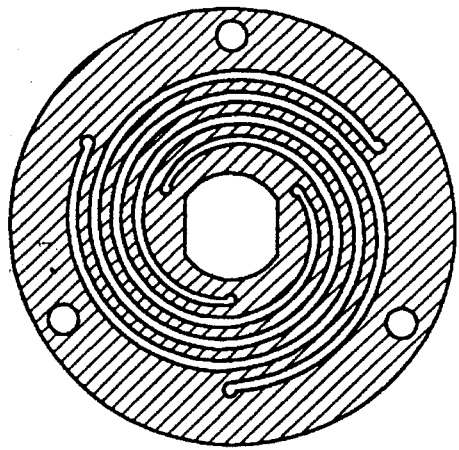

FIGS. 18a, 18b and 18c depict three forms of flat springs which may be used in the gyrating scan heads of the present invention. Each may be formed from a flat piece of metal such as beryllium copper by removing the light colored portions, such as by chemical etching. FIG. 18a is a spiral spring, with two concentric spirals starting at locations 180° apart. FIG. 18c is similar to FIG. 18a, with three concentric spirals starting at locations 120° apart, which may provide improved stiffness. FIG. 18b is a non-spiral spring having an outer generally circular web which may be mounted to the frame of the scan head, an inner generally circular web which may be mounted to a gyrating member, and an intermediate web. The intermediate web is spaced from both the inner web and the outer web by fingers, which as shown are radially directed. The spring of FIG. 18b aids in assembly of a scan head, tending to inhibit the core from being pulled laterally. While it is believe generally preferable to use one or more springs as the suspension member in a gyrating scan head, it is also possible to use a flat deformable membrane to suspend the gyrator. For instance, an elastomeric membrane may permit the gyrating motions described herein.

Covering an Area with Dense Omnidirectional Scan Patterns

Figure 12C:
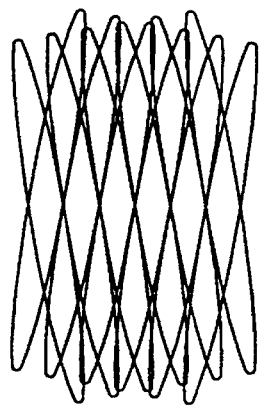
FIGS. 12a–12f illustrate various scan patterns which may be produced by scanning systems in accordance with the present invention.
Figure 12F:
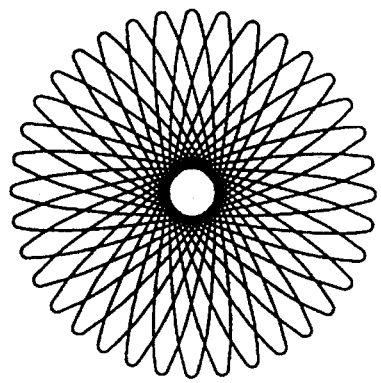
Figure 12B:
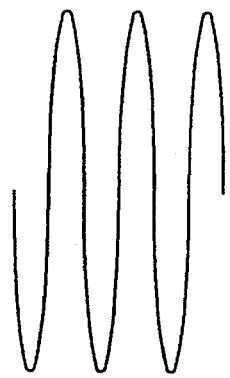
Figure 12E:
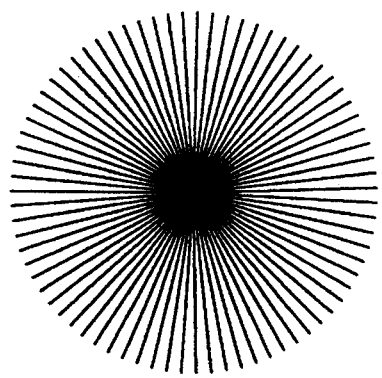
Figure 12A:
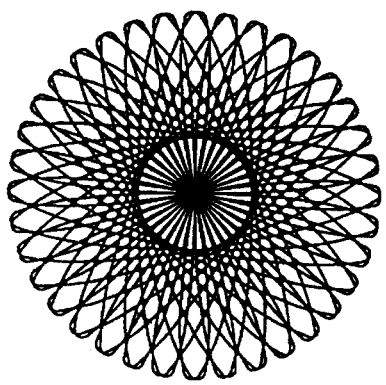
Figure 12D:
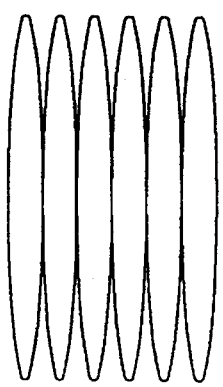

By introducing an alternating current into a coil of the scan head such as the one illustrated in FIG. 2 to produce a scan line while at the same time causing the motor to rotate the scan head continuously, a spinning scan line as illustrated in FIG. 12d may be produced. This is an extremely useful scan pattern for use when information such as bar code may be randomly oriented. In this case the bar code need only be placed near the center of the rotating line to completely scan it.

It has been discovered that at certain frequencies, not necessarily resonance frequencies, a thin ellipse may be produced instead of a line by even a simple single coil version of the scan head included in this invention such as is illustrated in FIG. 2. If ellipses are rotated then the effect of a simple two line raster is produced which may be spun at desired speeds by the motor.

This results in an even more efficient omnidirectional scanning pattern such as that shown in FIG. 12f. If instead of rotating the motor continuously it is caused to make quick partial rotations in clockwise, then counter clockwise directions at an appropriate rate while at the same time energizing the coil with a current of much higher frequency, dense partially rotating raster or lissajous patterns may be produced. These are more effective scan patterns for bar code scanning than those used at checkout counters which only produce a few fixed scan lines.

If a scan head with two coils, such as depicted in FIG. 5, is used to produce a raster pattern and this is rotated continuously with the motor a highly efficient scan pattern is produced. With this pattern a barcode may be placed off center of the rotation and still be successfully scanned. A pattern of this type is illustrated in FIG. 12a.

By operating the motor in various modes as described above and by driving the scan heads with AC currents of various waveforms at once many useful high density omnidirectional scan patterns may be produced. A few of these are shown in FIG. 12. FIGS. 12b and 12c show raster scans which may be produced. FIG. 12e shows a raster which is dithered, such as by partial rotation of a motor coupled to a scan head.

By virtue of their simplicity and versatility it is seen that the present scan head inventions eliminate a great deal of complexity and expense associated with obtaining results only previously achievable with many optical parts and motors.

Light Collection System

Now referring again to FIG. 1, light of the particular wavelength emitted by the light source 13 which is diffusely reflected from a scanned target may be collected by means of a lens, filtered in an appropriate optical filter 2 to remove unwanted wavelengths, and concentrated onto a suitable detector 3 such as a photo diode in order to capture information from the target.

Figure 11A:
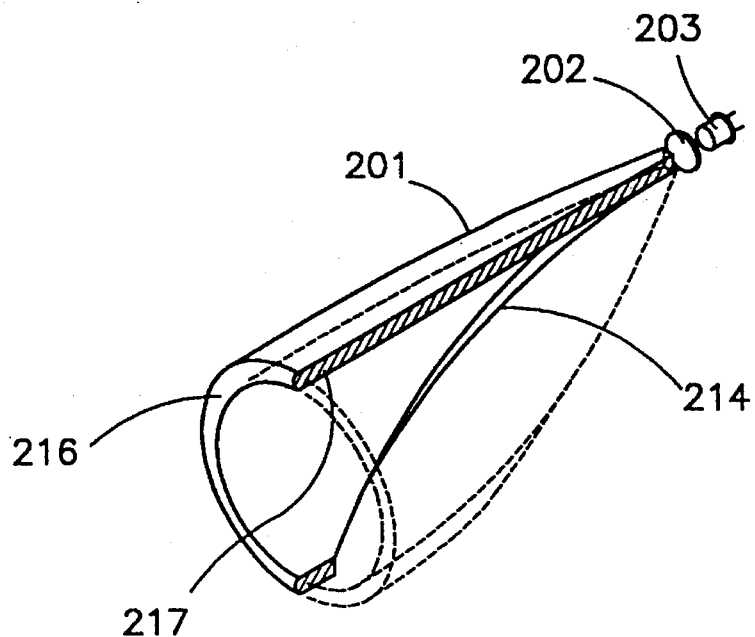
FIG. 11a is a partially cutaway perspective view of a light collector in accordance with the present invention.
Figure 11B:
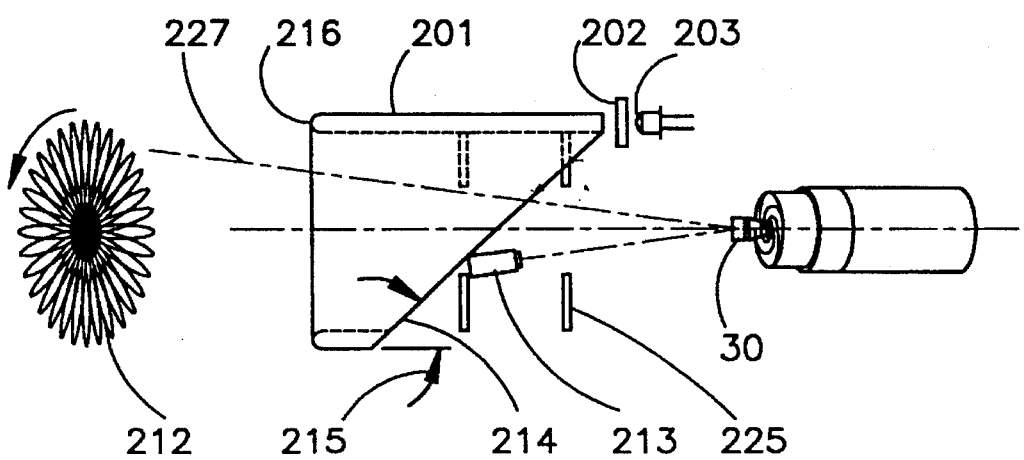

A novel light collector 201 has been incorporated in various embodiments of the inventions described hereinafter and may be understood by referring to FIGS. 11a and 11b. This light collector 201 consists of a hollow tube made from material which is generally transparent to the wavelength of light emitted by the scanner light source 213. The rear portion of collector 201 is sliced at an angle 215 so that it tapers almost to a point where the light detector 203 is located. All the surfaces of the collector are polished and the angle 215 at which it is sliced along surface 214 and tapered is such that total internal reflection of light entering the front portion 216 occurs and light entering the collector is guided and contained within it. Because of total internal reflection at the angled surface and at the inner and outer cylindrical surfaces of the tube 201, as light enters the input aperture defined by the front of the collector it will be effectively guided, concentrated and funneled through an output surface adjacent the filter 202 and into the detector 203. Since the front circumferential area of the collector 216 can easily be several square centimeters in area, its light collecting power can be quite large. Thus only a small area photo detector 203 is needed to detect the light signal returned. Also, due to its circular geometry this light collector 201 allows for the outgoing scanned beam 227 shown in FIG. 11b to exit through its center unimpeded whereupon scan pattern 212 may be projected upon a target. Since the collector 201 possesses essentially circular collection symmetry the efficient collection of light from a circular area covered by a spinning scan pattern in front of it may be efficiently collected.

The front of the collector 216 can be further enhanced if it is not made flat but rather given the curvature of a portion of a toroidal shape 217. Then its light gathering angular field of vision can be increased in the same manner that a positive lens can collect and concentrate light. This feature allows for efficient collection of light from a wide target area in front of the scanner. Yet another feature may be incorporated into this versatile light collector at very little cost by fabricating it from transparent colored material such as molding it from colored plastic so that it will only pass substantial light of the wavelength emitted by the scanning light source 213. In this manner the need for a separate optical filter 202 is eliminated.

While the preferred collector as shown comprises a truncated cylindrical shell with an input end face generally perpendicular to the cylinder axis, an end face at an acute angle with respect to the cylinder axis, and an output end face adjacent an end of the angled surface, variations which also efficiently concentrate light by total internal reflection may be made. For instance, if the angled slice intersects the input end face, the collector will be only partially annular in cross-section throughout its length, but will still operate as described.

Light Source and Focusing Assembly

Figure 15:
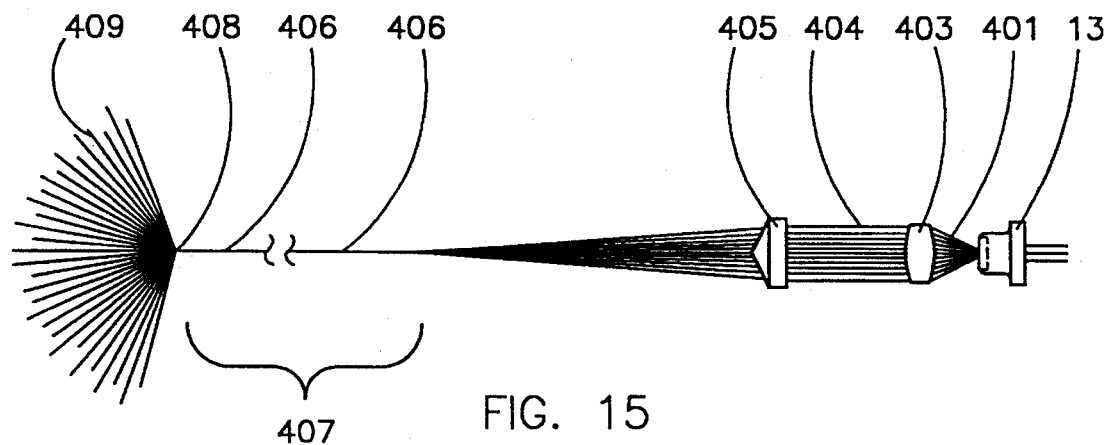
FIG. 15 illustrates a beam shaping system for producing a narrow beam near the scanner which rapidly diverges beyond a certain distance from the scanner.

FIG. 1 shows a light source 13 which may be a laser projecting a light beam into a beam shaping element 10. The beam shaping element 10 may be a fixed lens system, an aperture, a hologram or an adjustable focus element consisting of combinations of lenses and the like. A beam shaping element may also include a cone shaped lens element as depicted in FIG. 15. A conical lens 401 has recently been shown useful for generating a very narrow beam of laser light capable of being projected for a distance of many meters without the beam significantly diverging. Beyond a certain distance, however, such a beam formed by such a conical lens will then suddenly diverge extremely rapidly. The production of such long narrow beams by using conical lenses has been recently described by R. M. Herman and T. A. Wiggins in an article entitled "Production and Uses of Diffractionless Beams", J. Opt. Soc. Am. A/Vol. 8, No. 6/June 1991.

This type of beam can be of great use in scanning because the spot size projected on the target may be very small over great distances allowing for excellent resolution while at the same time it need not be specifically focused so long as the target is within range of the long distance beam. Thus excellent depth of field for scanning is achieved with beam shaping systems which include an appropriate cone lens in the design.

The rapid divergence property of these beams is a valuable safety feature especially when scanning with intense laser beams because in that it can be designed so once such a beam goes beyond the desired target area it dissipates rapidly and thereby eliminates a danger to the human eye. Since it is anticipated that it may be expensive to produce conical lenses of the quality needed to produce these special beams, it is possible that only a single master conical lens be fabricated. The master lens would then be used to fabricate holographic copies which identically mimic the master when laser light of the design wavelength is shone through them. The holograms so produced would be inexpensive to fabricate and may then be incorporated economically into mass produced scanners. Of course, conical lenses could be used if a method for inexpensive fabricating them were devised.

The scheme for producing these diffractionless beams is illustrated in FIG. 15. The light from a laser light source 13 is emitted in a divergent beam 401 after which it is collimated by a collimating lens 402. The collimated light 404 enters a cone shaped lens 405 and a diffractionless beam 406 is formed. The diffractionless beam 406 may be made very narrow, on the order of a few microns to a few hundred microns in diameter, and it can propagate many meters down range 407 without spreading out. Finally at a distant point 408 the beam 409 rapidly dissipates.

Another such beam shaping device has been described in the 13 Apr. 1987 edition of "Physical Review Letters", vol. 58, number 15 on pages 1499–1501 by J. Durnin and J. J. Miceli, Jr. and J. H. Eberly. The title of the article is "Diffraction Free Beams" and describes how narrow beams may be projected in free space by means of a disk with a circular aperture in combination with a lens.

Figure 16:
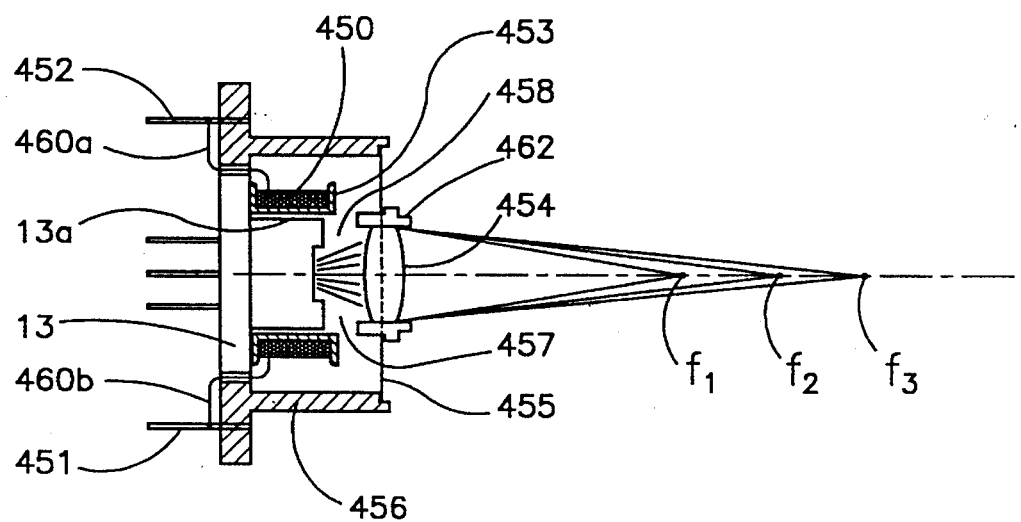
FIG. 16 is a cross-section of an electrical focusing system.

Now referring to FIG. 16 another beam focusing mechanism is depicted. The operation of this focussing element is described as follows. A laser diode light source 13 is mounted in a magnetically conductive case 456. The upper portion of the laser diode 13a is surrounded by a coil 450 wound on a bobbin 453. Coil lead wires 460a and 460b are terminated at terminal pins 450 and 451. The terminal pins 450 and 451 are anchored in and electrically insulated from the magnetically conductive case 456. The enclosure of the laser diode 13 itself is also made from magnetic metal.

A strong positive lens 454 is mounted and suspended by a flat magnetically conductive spring 455. Lens holder 462 may also be made from a magnetically conductive material. Thus a magnetic path is formed by the body of the laser 13, the magnetically conductive laser holder 456, and the spring 455 with an air gap in area 458.

As current is applied to the coil 450, the body of the laser diode 13 becomes an electromagnet and thereby attracts and pulls in the magnetic spring 455 holding the lens 454. Moving the lens closer to the laser source causes the focal point of the laser beam from its initial point at $f_1$ to a point farther down range at $f_2$ or $f_3$ when stronger current is applied to the coil. The current may be controlled by appropriate means to give a great depth of field to the position of the scanning spot. Furthermore if a slow alternating current is applied to the coil the focal point of the laser beam spot will sweep back and forth down range and back. At the same time the beam may be scanned at a relatively fast rate and the probability of reading a bar code at any point within a large depth of field is greatly enhanced. Obviously the benefit of such a focusing element is much improved over a fixed lens type commonly used in many barcode reading scanners.

Compact Barcode Reading Systems

Figure 9:
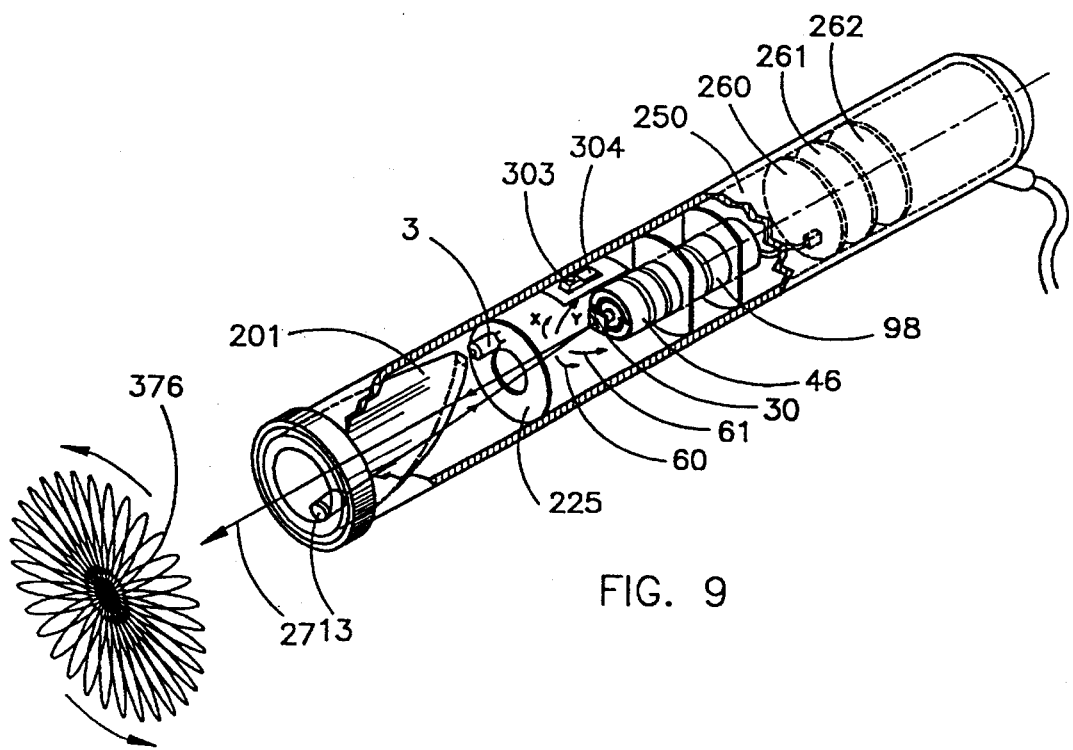
FIG. 9 is a partially cut away view of a scanning system according to the present invention mounted in a flashlight-style housing.

FIG. 9 depicts a complete scanning data acquisition system incorporating various previously described aspects.

Figure 10A:
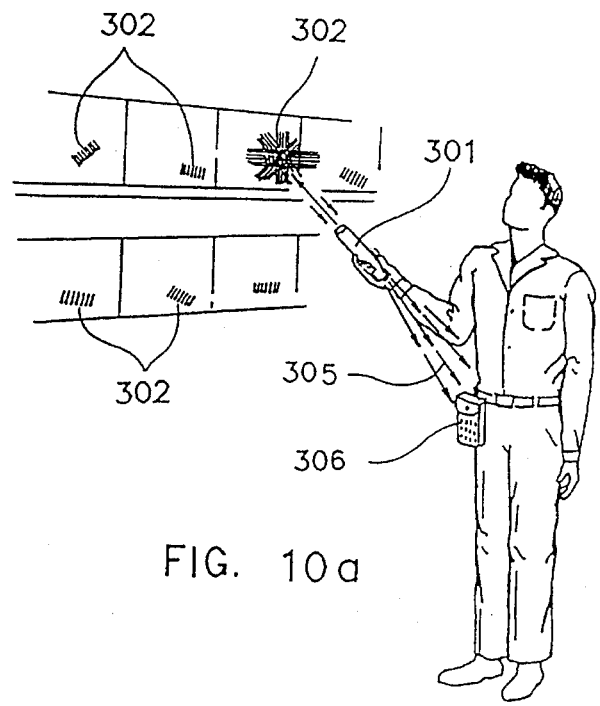
FIG. 10a is an illustration of person using a hand-held scanner in accordance with the present invention in order to scan randomly oriented information.
Figure 10C:
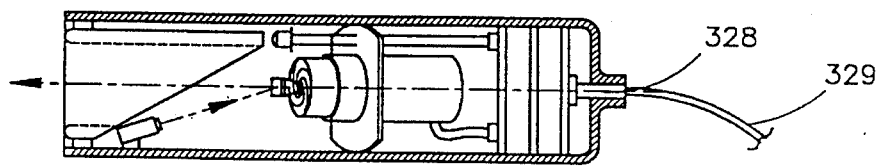
FIG. 10c is a partially cutaway view of a hand-held scanner which receives power from and communicates scanned information to a remote location over a cable.
Figure 10B:
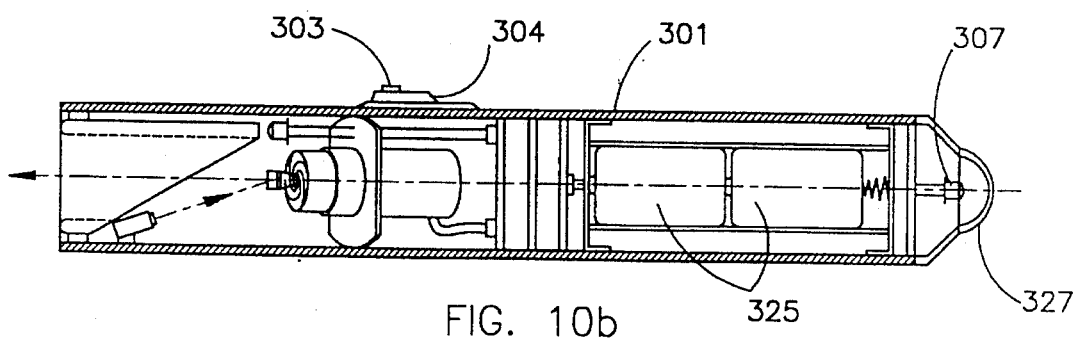
FIG. 10b is a cutaway view of a self powered hand-held scanner with means for wireless communication of scanned information to a remote location.

Due to the efficient geometry of the scan heads described and the light collector 201, packaging in a flashlight style housing 250 is practical. This style housing is amenable to portable hand held battery powered bar code reading applications as shown in FIG. 10a. In this application the user merely points the scanner 301 at a barcode target 302 for example, without the need to precisely align the scan pattern, and presses the intermittent button switch 303 on the switch 304 with his thumb as one would operate a flashlight. A continuously on position may also be provided on switch 304. In this embodiment the need for the wires or cables of FIGS. 9 and 10b may be eliminated and the information signal 305 transmitted a short distance to a portable terminal 306 attached to the user's waist by means of a modulated light beam such as may be generated by an infrared emitting diode 307 as shown in FIG. 10b. Both the terminal and the scanner may transmit and receive signals by a two way infrared data link. Upon successfully reading a target a beeping sound may be emitted from the device to indicae this and the power to the laser and other power consuming parts is desirably automatically reduced to conserve battery power.

Figure 13:
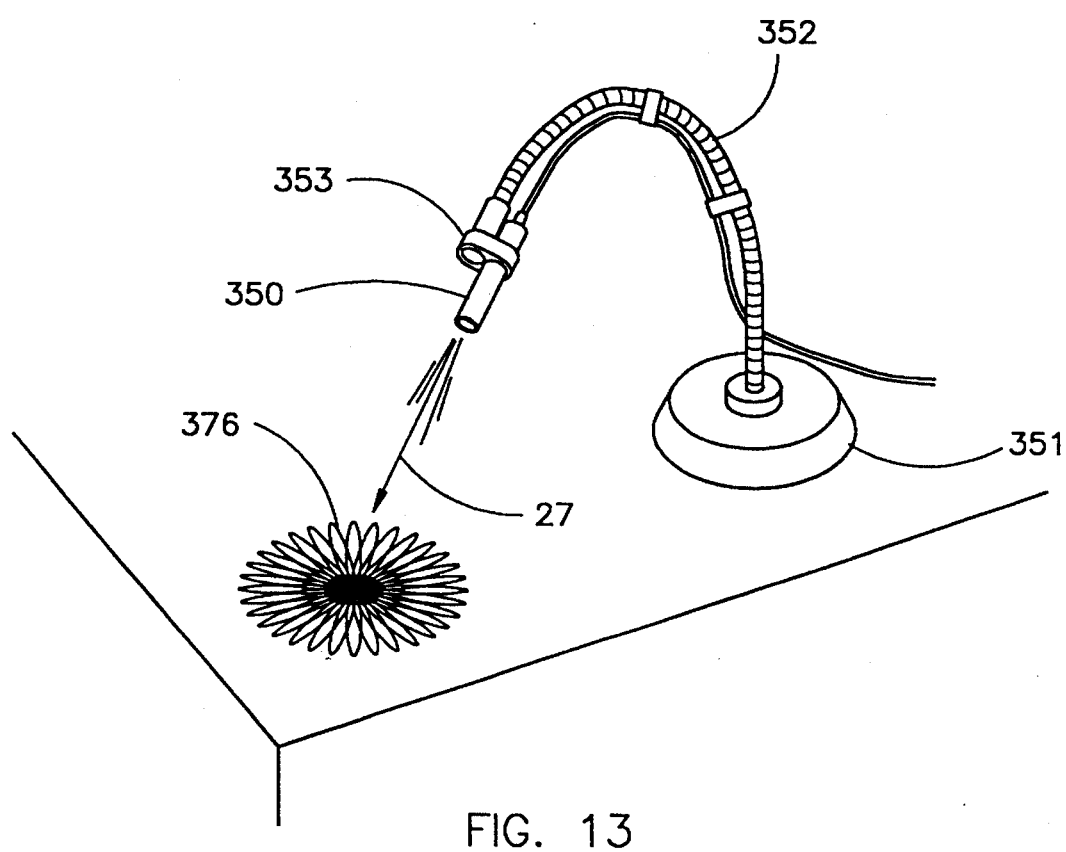
FIG. 13 illustrates a means of flexibly mounting a scan head.

For fixed mount applications, a scanner 350 may be supported in a microphone style stand 351 having a flexible goose neck 352 as shown in FIG. 13 or it may be easily attached with a clamp 353 to some fixed object in limited space. Another popular housing of a gun shape may be easily accommodated by virtue of the compactness of the scan head design of this invention.

Figure 14:
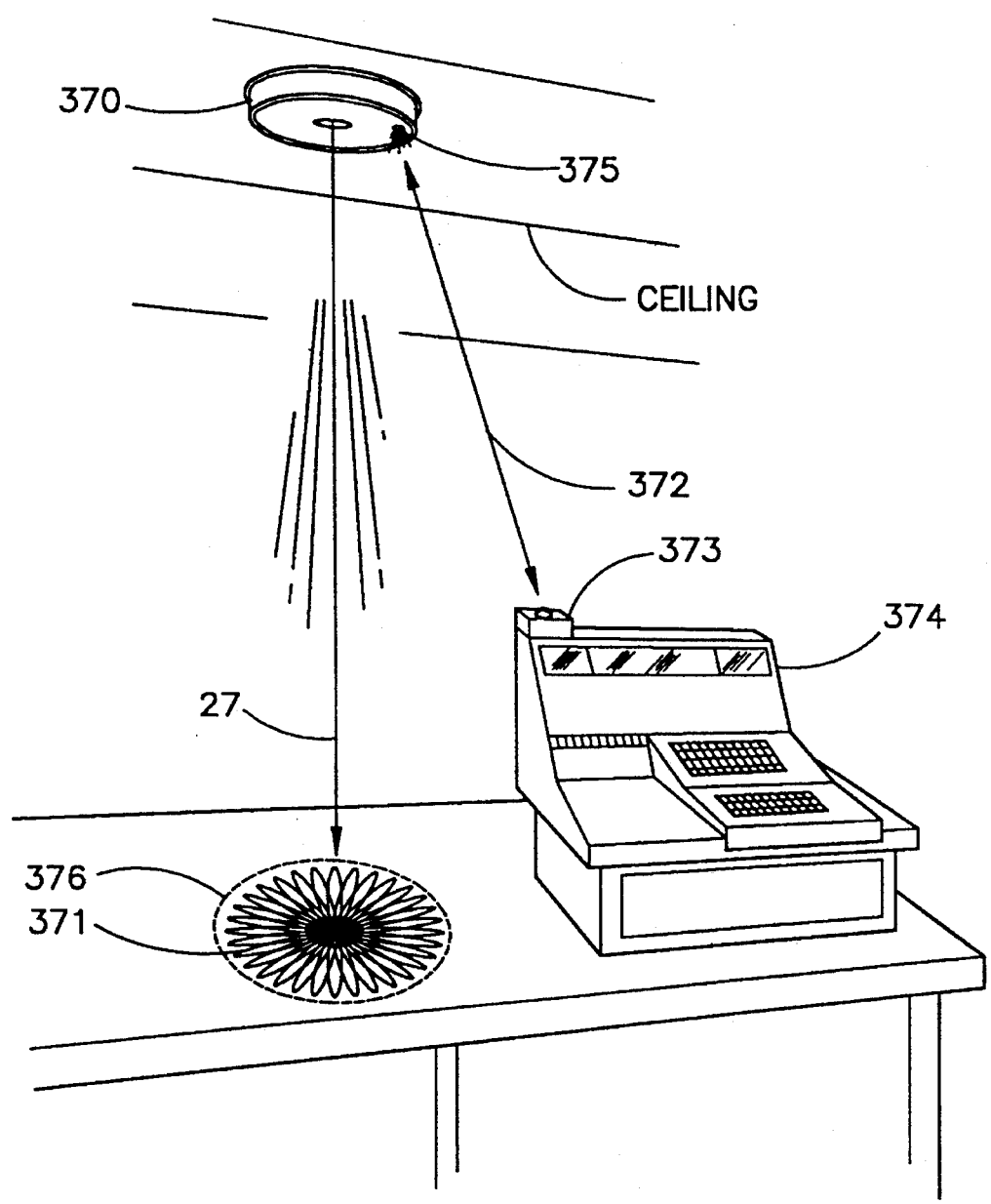
FIG. 14 illustrates a point of sale system utilizing a ceiling, mounted scanning system.

In yet another embodiment shown in FIG. 14, elements of the invention are incorporated into a ceiling mounted housing 370 that resembles a smoke detector. In this style housing the elements schematically depicted in FIG. 1 are arranged so that the scan pattern is directed downward. This is a very useful application for a check out counter in a store where bar code information is read because it leaves the counter area completely clear and uncluttered. Also this barcode reading device is much easier to mount than popular ones now available which require holes or slots in the checkout counter over which barcode targets are to be passed.

In the ceiling mounted scanner 370, power is supplied to the device through the ceiling. A scan cycle may be initiated by short range signals 372 transmitted and received between a transceiver 373 on the checkout terminal 274 and a transceiver incorporated in the ceiling scanner 370. The scan information collected by the ceiling unit 370 is transmitted by this up/down link 375, 372, 373 thereby eliminating the need for wires dangling from the ceiling. Of course a wire can be used in applications where this is not objectionable. The infrared LED type or ultrasonic type transmitter-receiver units of the kind commonly used for remote controlled television sets are well suited to this data transmission task.

High speed transmission of information is easily achievable with proper selection of components. The line of sight nature of the infrared transmitter receiver precludes interference with other such checkout systems operating in the local vicinity while the ultrasonic types are not as sensitive to line of sight operation.

When it is desired to scan a barcode with this counter top installation the target item is moved into the target area on the counter top and a motion detector, perhaps mounted in the ceiling unit, may trigger the scan cycle. There are many other ways of initiating the scan cycle. Infrared or ultrasonic motion detectors of the kind used in security systems are capable of this function; so are foot switches which would allow the checkout personnel to manually initiate the scan cycle. A simple light beam interruption switch would also work.

Scanning systems according to the invention may in general be fabricated using various combination of the individual attributes described in the various embodiments. For instance, they may use scan heads which gyrate in either one dimension (e.g. FIG. 2) or two dimensions (e.g. FIG. 5). They may use either a single suspension (e.g. FIG. 19) or several suspensions (e.g. FIG. 2). Each suspension may consist of a single resilient member (e.g. FIG. 5) or several resilient members (e.g. FIGS. 7 and 8). The scan head may be adapted to fixed mounting (e.g. FIG. 7) or rotatable mounting (e.g. FIG. 8), and if rotatable a motor may be provided to do so (e.g. FIG. 6). The scan heads may use a gyrating magnet assembly (e.g. FIG. 2) or a gyrating coil assembly (e.g. FIG. 19). Scanning data acquisition systems may be adapted for fixed mounting (e.g. FIG. 14), hand holdable (e.g. FIG. 10a–c), or both (e.g. FIG. 13). They may communicate with remote information processing systems by wireless means (e.g. FIG. 14) or wire-like means (e.g. FIG. 9). Such systems desirably, but need not, include a light concentrator as depicted in FIG. 11 and a beam shaping means as depicted in FIG. 15 or 16.

While various embodiments of the invention have been set forth, variations will no doubt occur to those skilled in the art without departing from the spirit and scope of the invention.

What is claimed is:

1. Apparatus for producing gyrating motion comprising:
   a frame;
   a gyrating member adjacent said frame;
   a first resilient suspension, coupled to said frame and coupled to said gyrating member at a first location thereon;
   a second resilient suspension, coupled to said frame and coupled to said gyrating member at a second location thereon, said second location and said first location defining an axis of gyration of said gyrating member, said first and second suspensions suspending said gyrating member in an equilibrium position with respect to said frame, said second suspension permitting motion of said gyrating member at said second location in at least one direction perpendicular to said axis of gyration and providing a restoring force on said second location when displaced from its equilibrium position; and
   means for applying a force to said gyrating member with respect to said frame to induce gyrating motion of said gyrating member.

2. Apparatus according to claim 1, wherein said second suspension is symmetric with respect to said axis of gyration.

3. Apparatus according to claim 1, wherein said second suspension comprises a spring.

4. Apparatus according to claim 3, wherein said spring is a flat spring.

5. Apparatus according to claim 4, wherein said flat spring is a spiral spring.

6. Apparatus according to claim 4, wherein said flat spring is made of metal.

7. Apparatus according to claim 3, wherein said second suspension comprises a plurality of flat springs.

8. Apparatus according to claim 7, wherein said springs are spaced along said axis of gyration by one or more separating members.

9. Apparatus according to claim 1, wherein said second suspension comprises a deformable membrane.

10. Apparatus according to claim 1, wherein said force applying means comprises electromagnetic force applying means.

11. Apparatus according to claim 10, wherein said force applying means includes a permanent magnet.

12. Apparatus according to claim 10, wherein said force applying means includes a coil.

13. Apparatus according to claim 10, wherein said force applying means includes a magnet comprising said gyrating member.

14. Apparatus according to claim 13, wherein said magnet has a generally cylindrical shape.

15. Apparatus according to claim 13, wherein said magnet produces a field directed generally perpendicular to said axis of gyration.

16. Apparatus according to claim 13, wherein said force applying means includes two magnets comprising said gyrating member.

17. Apparatus according to claim 16, wherein said magnets are displaced from one another along said axis of gyration.

18. Apparatus according to claim 16, wherein each of said magnets produces a field directed generally perpendicular to said axis of gyration.

19. Apparatus according to claim 16, wherein each of said magnets produces a field which is generally perpendicular to that of the other.

20. Apparatus according to claim 16, wherein said electromagnetic force applying means includes a coil which is mechanically secured to said frame.

21. Apparatus according to claim 20, wherein said coil has an axis which is generally collinear with said axis of gyration.

22. Apparatus according to claim 20, wherein said electromagnetic force applying means includes two coils which are mechanically secured to said frame.

23. Apparatus according to claim 22, wherein said coils are generally coaxial with said axis of gyration and displaced from one another along said axis of gyration.

24. Apparatus according to claim 23, wherein said gyrating member comprises two magnets displaced from one another along said axis of gyration, and each of said coils is disposed adjacent one of said magnets.

25. Apparatus according to claim 10, wherein said electromagnetic force applying means includes magnetic field guiding means.

26. Apparatus according to claim 25, wherein said magnetic field guiding means comprises said frame.

27. Apparatus according to claim 25, wherein said frame comprises a generally cylindrical shell of high permeability material.

28. Apparatus according to claim 27, wherein said shell is generally coaxial with said axis of gyration, and said electromagnetic force applying means includes a magnet comprising said gyrating member and a coil coaxially disposed between said frame and said magnet.

29. Apparatus according to claim 1, wherein said first suspension is a resilient suspension.

30. Apparatus according to claim 29, wherein said first suspension and said second suspension have substantially the same structure.

31. Apparatus according to claim 1, wherein said frame includes means for mounting said apparatus in an optical scanning device.

32. Apparatus according to claim 31, wherein said apparatus mounting means includes means for rigidly securing said apparatus to said scanning device.

33. Apparatus according to claim 31, wherein said apparatus mounting means includes means for rotatably securing said apparatus to said scanning device.

34. Apparatus according to claim 33, wherein said rotatable securing means includes a motor having a shaft and means for securing said frame to said shaft.

35. Apparatus according to claim 34, wherein said shaft is generally collinear with said axis of gyration.

36. Apparatus according to claim 33, wherein said mounting means includes commutator means for supplying current to said apparatus during rotation of said apparatus.

37. Apparatus according to claim 1, wherein said gyrating member includes an optical element.

38. Apparatus according to claim 37, wherein said optical element is disposed along said axis of gyration.

39. Apparatus according to claim 37, wherein said optical element is not disposed between said suspensions.

40. Apparatus according to claim 37, wherein said optical element is a reflective element.

41. Apparatus according to claim 38, wherein said optical element is a generally flat mirror.

42. Apparatus according to claim 38, wherein said optical element is a refractive element.

43. An electromagnetically operated gyrating scan head comprising:

a frame;

a gyrating member adjacent said frame;

a resilient suspension, coupled to said frame and to said gyrating member, said suspension supporting said gyrating member in an equilibrium position with respect to said frame, permitting gyrating motion of said gyrating member from said equilibrium position, said gyrating motion being within a plane perpendicular to an axis of gyration, and applying a restoring force to said gyrating member urging said gyrating member toward its equilibrium position when displaced therefrom; and electromagnetic means for applying a gyrating force to said gyrating member to move said gyrating member from its equilibrium position, said electromagnetic means including a coil having a coil axis which is generally collinear with said axis of gyration and a magnet having a magnetic axis which is generally perpendicular to said axis of gyration.

44. A scan head according to claim 43, wherein said coil is secured to said frame.

45. A scan head according to claim 43, wherein said gyrating member comprises said coil.

46. A scan head according to claim 43, wherein said magnet is secured to said frame.

47. A scan head according to claim 43, wherein said gyrating member comprises said magnet.

48. A scan head according to claim 43, wherein said electromagnetic means includes a pair of coaxially disposed coils.

49. A scan head according to claim 43, wherein said electromagnetic means includes a pair of magnets, each of which has a magnetic axis which is generally perpendicular to said axis of gyration.

50. A scan head according to claim 49, wherein the magnetic axis of each of said magnets is generally perpendicular to that of the other.

51. A scan head according to claim 43, wherein said electromagnetic means includes a pair of coils which are coaxially disposed and spaced from one another along said axis of gyration, and a pair of magnets spaced from one another along said axis of gyration, each of which magnets is adjacent one of said coils.

52. A scan head according to claim 43, wherein said suspension comprises a generally planar member disposed generally perpendicular to said axis of gyration.

53. A scan head according to claim 52, wherein said planar member is a spring.

54. A scan head according to claim 53, wherein said planar member is a spiral spring.

55. A scan head according to claim 52, wherein said suspension consists of a single generally planar member disposed generally perpendicular to said axis of gyration.

56. A scan head according to claim 52, wherein said suspension comprises two or more generally planar members, each of which is disposed generally perpendicular to said axis of gyration and each of which is spaced from the others along said axis of gyration.

57. A scan head according to claim 43, wherein said scan head is substantially symmetric in one direction perpendicular to said axis of gyration.

58. A scan head according to claim 43, wherein said scan head is substantially radially symmetric with respect to said axis of gyration.

59. A scan head according to claim 43, wherein said frame includes means for securing said scan head to a motor shaft.

60. A scan head according to claim 59, wherein said frame includes means for supplying electrical current to said electromagnetic means.

61. A scan head according to claim 60, wherein said current supplying means includes a commutator.

62. A scan head according to claim 60, wherein said current supplying means includes flexible coil leads mechanically secured to said frame.

\* \* \* \* \*